United States Patent
Hu et al.

(10) Patent No.: US 10,973,118 B2
(45) Date of Patent: Apr. 6, 2021

(54) FLEXIBLE CONDUCTIVE FILM, ITS MANUFACTURING METHOD, FLEXIBLE TOUCH SCREEN AND FLEXIBLE DISPLAY PANEL

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Haifeng Hu, Beijing (CN); Ting Zeng, Beijing (CN); Taofeng Xie, Beijing (CN); Liuyue Yin, Beijing (CN); Youting Zhang, Beijing (CN); Weijie Ma, Beijing (CN)

(73) Assignees: BOE TECHNOLOGY GROUP CO., LTD., Beijing (CN); HEFEI XINGSHENG OPTOELECTRONICS CO., LTD., Anhui (CN)

( * ) Notice: Subject to any disclaimer, the term of this patent is extended or adjusted under 35 U.S.C. 154(b) by 384 days.

(21) Appl. No.: 15/751,031

(22) PCT Filed: Jun. 20, 2017

(86) PCT No.: PCT/CN2017/089211
§ 371 (c)(1),
(2) Date: Feb. 7, 2018

(87) PCT Pub. No.: WO2018/036248
PCT Pub. Date: Mar. 1, 2018

(65) Prior Publication Data
US 2020/0092990 A1  Mar. 19, 2020

(30) Foreign Application Priority Data
Aug. 26, 2016 (CN) .......... 201610741256.7

(51) Int. Cl.
| | |
|---|---|
| *H01L 27/32* | (2006.01) |
| *H01L 51/56* | (2006.01) |
| *H01B 5/14* | (2006.01) |
| *H01B 1/02* | (2006.01) |
| *H05K 1/02* | (2006.01) |
| *G06F 3/044* | (2006.01) |
| *H05K 1/09* | (2006.01) |
| *H05K 3/12* | (2006.01) |
| *G09F 9/30* | (2006.01) |

(52) U.S. Cl.
CPC .......... *H05K 1/0277* (2013.01); *G06F 3/044* (2013.01); *H01B 1/02* (2013.01); *H01B 5/14* (2013.01); *H05K 1/097* (2013.01); *H05K 3/1283* (2013.01); *G09F 9/301* (2013.01)

(58) Field of Classification Search
None
See application file for complete search history.

(56) References Cited

U.S. PATENT DOCUMENTS

| | | | |
|---|---|---|---|
| 2007/0298253 A1 | 12/2007 | Hata et al. | |
| 2012/0156476 A1* | 6/2012 | Jo | .......... B32B 15/08 |
| | | | 428/336 |
| 2015/0118413 A1 | 4/2015 | Kawato et al. | |
| 2016/0128187 A1* | 5/2016 | Liou | .......... H05K 3/386 |
| | | | 174/253 |

FOREIGN PATENT DOCUMENTS

| | | |
|---|---|---|
| CN | 101292362 A | 10/2008 |
| CN | 101597019 A | 12/2009 |
| CN | 102529302 A | 7/2012 |
| CN | 103109391 A | 5/2013 |
| CN | 103985434 A | 8/2014 |
| CN | 104303242 A | 1/2015 |
| CN | 106297967 A | 1/2017 |
| JP | 2006-252980 A | 9/2006 |
| WO | 2011/040752 A2 | 4/2011 |

OTHER PUBLICATIONS

International Search Report and Written Opinion dated Sep. 30, 2017; PCT/CN2017/089211.
Chinese Priority Search Report dated Mar. 1, 2017; Appln. No. 201610741256.7.
The First Chinese Office Action dated Apr. 1, 2017; Appln. No. 201610741256.7.
The Second Chinese Office Action dated Jun. 28, 2017; Appln. No. 201610741256.7.
The Third Chinese Office Action dated Sep. 12, 2017; Appln. No. 201610741256.7.

* cited by examiner

*Primary Examiner* — Sheeba Ahmed (57) ABSTRACT

A flexible conductive film and its manufacturing method are provided. A flexible touch screen and a flexible touch display panel including the flexible conductive film are also provided. The manufacturing method of a flexible conductive film includes: providing a first substrate; applying a first conductive metal ink on the first substrate and forming a first conductive metal pattern; applying a polyimide varnish on a surface of the first substrate having the first conductive metal pattern; soaking the first substrate in deionized water after the polyimide varnish has been solidified; and detaching the solidified polyimide varnish and the first conductive metal pattern from the first substrate to obtain the flexible conductive film. The flexible conductive film prepared can be used in a flexible touch screen and a flexible display panel to improve the adhesion of nanosilver material to a flexible substrate, and to improve its stability of mechanical strength.

17 Claims, 5 Drawing Sheets

FLEXIBLE CONDUCTIVE FILM, ITS MANUFACTURING METHOD, FLEXIBLE TOUCH SCREEN AND FLEXIBLE DISPLAY PANEL

TECHNICAL FIELD

Embodiments of the present disclosure relate to a flexible conductive film, its manufacturing method, a flexible touch screen and a flexible display panel.

BACKGROUND

In the field of display technology, a metal mesh structure is more suitable for flexible display devices than brittle indium tin oxide due to its higher ductility. Although the metal mesh structure is flexible, it has a bad adhesion to a flexible polymer surface, rendering the stability of its mechanical strength unsatisfactory. Accordingly, for a better application of the metal mesh structure in the flexible display devices, improvement in the adhesion of the metal mesh structure to the polymer surface is desirable.

SUMMARY

At least one embodiment of the present disclosure provides a manufacturing method of a flexible conductive film which comprises: providing a first substrate; applying a first conductive metal ink on the first substrate and forming a first conductive metal pattern; applying a polyimide varnish on a surface of the first substrate having the first conductive metal pattern; soaking the first substrate in deionized water after the polyimide varnish has been solidified; and detaching the solidified polyimide varnish and the first conductive metal pattern from the first substrate to obtain the flexible conductive film.

For example, a manufacturing method provided by at least one embodiment of the present disclosure may further comprise: providing a second substrate; applying a second conductive metal ink on the second substrate and forming a second conductive metal pattern; attaching a side of the second substrate having the second conductive metal pattern onto the polyimide varnish applied on the first substrate before the polyimide varnish is solidified; soaking the first substrate and the second substrate in deionized water after the polyimide varnish sandwiched between the first substrate and the second substrate has been solidified.

For example, a manufacturing method provided by at least one embodiment of the present disclosure may further comprise plasma treating the first conductive metal pattern to remove insulating material from the first conducting metal pattern.

For example, a manufacturing method provided by at least one embodiment of the present disclosure may further comprise: plasma treating the second conductive metal pattern to remove insulating material from the second conducting metal pattern.

For example, in a manufacturing method provided by at least one embodiment of the present disclosure, the insulating material may comprise polyvinylpyrrolidone.

For example, in a manufacturing method provided by at least one embodiment of the present disclosure, plasma treating may be carried out in a protective atmosphere or in a reactive atmosphere.

For example, in a manufacturing method provided by at least one embodiment of the present disclosure, the protective atmosphere may be any one or any combination of argon, helium, nitrogen and neon.

For example, in a manufacturing method provided by at least one embodiment of the present disclosure, the reactive atmosphere may be any one or any combination of air, oxygen, hydrogen, ammonia, and carbon dioxide.

For example, in a manufacturing method provided by at least one embodiment of the present disclosure, the first conductive metal ink may comprise nanosilver, nanogold or nanocopper.

For example, in a manufacturing method provided by at least one embodiment of the present disclosure, the first conductive metal ink may comprise nanometal wires or nanometal particles.

For example, in a manufacturing method provided by at least one embodiment of the present disclosure, the second conductive metal ink may comprise nanosilver, nanogold or nanocopper.

For example, in a manufacturing method provided by at least one embodiment of the present disclosure, the second conductive metal ink may comprise nanometal wires or nanometal particles.

For example, in a manufacturing method provided by at least one embodiment of the present disclosure, the first conductive metal ink may be different from the second conductive metal ink.

At least one embodiment of the present disclosure further provides a flexible conductive film which comprises a solidified polyimide varnish and a conductive metal pattern embedded in the solidified polyimide varnish.

For example, in a flexible conductive film provided by at least one embodiment of the present disclosure, the conductive metal pattern may be made of nanosilver, nanogold or nanocopper.

For example, in a flexible conductive film provided by at least one embodiment of the present disclosure, the conductive metal pattern may comprise a first conductive metal pattern embedded in a first surface of the solidified polyimide varnish and/or a second conductive metal pattern embedded in a second surface of the solidified polyimide varnish.

For example, in a flexible conductive film provided by at least one embodiment of the present disclosure, the first conductive metal pattern may be separated from the second conductive metal pattern by the solidified polyimide varnish.

For example, in a flexible conductive film provided by at least one embodiment of the present disclosure, the first conductive metal pattern may have a thickness ranging from about 1 μm to about 10 μm, the second conductive metal pattern may have a thickness ranging from about 1 μm to about 10 μm, the polyimide varnish may have a thickness ranging from about 50 μm to about 250 μm.

At least one embodiment of the present disclosure further provides a flexible touch screen which comprises: a flexible substrate and any above-mentioned flexible conductive film disposed on the flexible substrate.

At least one embodiment of the present disclosure further provides a flexible display panel which comprises: a flexible substrate; and any above-mentioned flexible conductive film disposed on the flexible touch substrate.

BRIEF DESCRIPTION OF THE DRAWINGS

In order to clearly illustrate the technical solution of the embodiments of the disclosure, the drawings of the embodiments will be briefly described. It is apparent that the described drawings are only related to some embodiments of the disclosure and thus are not limitative of the disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

For example, the method of manufacturing a nanosilver mesh structure on a flexible substrate comprises: applying a nanosilver solution on the substrate to obtain a nanosilver film, and then patterning the nanosilver film to form the nanosilver pattern. However, the nanosilver pattern has a poor adhesion to the flexible substrate, and thus its mechanical strength is also poor.

In order to solve the problem of poor adhesion between the nanosilver film and the flexible substrate, available methods include: applying a transparent adhesive onto the substrate before applying the nanosilver solution; introducing a transparent adhesive into the process of forming the nanosilver pattern; mechanical pressing to increase the contact area between the silver nanopattern and the substrate, or annealing treatment. But adding an adhesive may result in an increase in the thickness of the electrode, and the mechanical pressing may cause damage to the structure of the electrode, and the annealing treatment may lead to the destruction of the film, so the effects of these methods are not ideal.

Such poor adhesion of a nanometal mesh to a surface of the flexible material limits its application in the field of flexible electronics.

At least one embodiment of the present disclosure provides a flexible conductive film, its manufacturing method, a flexible touch screen and a flexible display panel. The manufacturing method of the flexible conductive film comprises: providing a first substrate; applying a first conductive metal ink on the first substrate and forming a first conductive metal pattern; applying a polyimide varnish on a surface of the first substrate having the first conductive metal pattern; soaking the first substrate in deionized water after the polyimide varnish has been solidified; and detaching the solidified polyimide varnish and the first conductive metal pattern from the first substrate to obtain the flexible conductive film.

The flexible conductive film prepared can be used in a flexible touch screen and a flexible display panel to improve adhesion of a nanometal (for example, nanosilver material) to a flexible substrate, and to improve its stability of mechanical strength.

Figure 1:
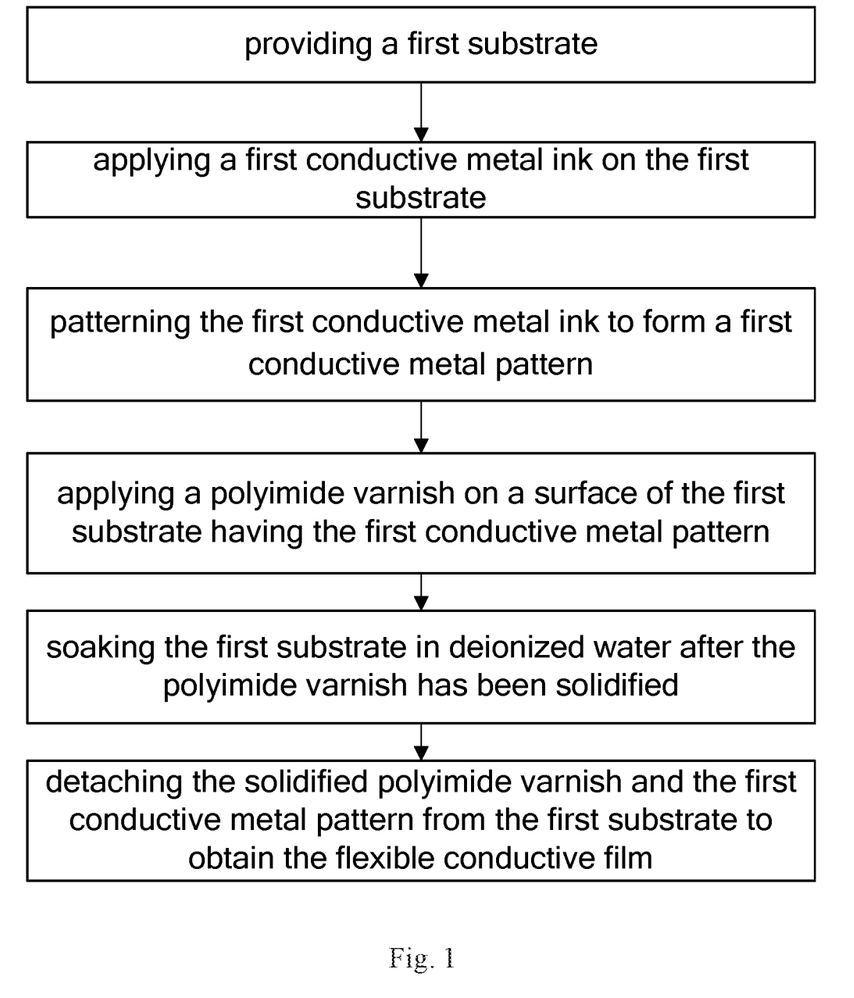
FIG. 1 is a flow diagram of a manufacturing method of a flexible conductive film provided by an embodiment of the present disclosure.

At least one embodiment of the present disclosure provides a manufacturing method of a flexible conductive film. FIG. 1 is a flow diagram of a manufacturing method of a flexible conductive film provided by an embodiment of the present disclosure. As illustrated in FIG. 1, the manufacturing method of the flexible conductive film comprises the following steps.

Providing a first substrate, for example a glass substrate, a quartz substrate, etc.

Applying a first conductive metal ink on the first substrate. For example, the first conductive metal ink is a transparent ink mixed with a nanometal. The transparent ink may be a thermoplastic polyurethane with a relative molecular mass of about $10^4$ to $10^6$. For example, the thermoplastic polyurethane is prepared from the reaction between an aliphatic or aromatic isocyanate with a polyester or polyether type curing agent, and the thermoplastic polyurethane is transparent in a visible light region. The thickness of the first conductive metal ink applied may range from about 100 nm to about 100 μm. The nanometal may be prepared by a liquid phase reduction method. Insulating polyvinylpyrrolidone (PVP) is usually retained on the surface of the nanometal prepared by the liquid phase reduction method. For example, the nanometal in the first conductive metal ink comprises nanosilver, nanogold or nanocopper, and the nanometal may be in a form of nanometal wires or nanometal particles. For instance, the size of the nanometal ranges from about 50 nm to about 100 nm, for example, is about 50 nm, 80 nm or 100 nm.

Patterning the first conductive metal ink to form the first conductive metal pattern. For example, the patterning process uses photolithography which comprises the operations such as applying a photoresist, exposing and developing the photoresist, and so on. The obtained first conductive metal pattern may include a plurality of strip electrodes that are parallel to each other and are spaced at intervals (for example, as illustrated in FIG. 4B and FIG. 4C).

In the embodiments of the present disclosure, the first conductive metal pattern may be obtained by other methods. For example, the first conductive metal pattern may be obtained in the process of applying the first conductive metal ink onto the first substrate by inkjet printing or screen printing.

Afterwards, the solvent in the first conductive metal ink is volatilized or removed by placing it for a certain time or baking.

Applying a polyimide varnish on a surface of the first substrate having the first conductive metal pattern. Polyimide varnish has the characteristics of strong tensile strength and great water absorption.

Soaking the first substrate in deionized water after the polyimide varnish has been solidified. After placing the solidified polyimide varnish into the deionized water, the polyimide varnish is easy to be removed from the first substrate due to moisture absorption and swelling in the deionized water.

Detaching the solidified polyimide varnish and the first conductive metal pattern from the first substrate to obtain the flexible conductive film. The flexible conductive film is a film in which the conductive metal pattern is embedded in a surface of the solidified polyimide varnish.

For example, between forming the first conductive metal pattern on the first substrate and applying the polyimide varnish, the first conductive metal pattern may be plasma treated to remove insulating materials such as polyvinylpyrrolidone (PVP) from the surface of the first conductive metal pattern.

For example, the plasma may be generated by a radio frequency tube with a power of about 10 W to 5000 W, and the first conductive metal pattern is plasma treated for about 30 seconds to 30 minutes. For example, plasma treating may be carried out in a protective atmosphere or in a reactive atmosphere. The protective atmosphere is any one or any combination of argon, helium, nitrogen and neon, and the reactive atmosphere is any one or any combination of air, oxygen, hydrogen, ammonia, and carbon dioxide.

After the first conductive metal pattern is treated by plasma with the power range and time range described above, the scanning electron micrograph of the first conductive metal pattern after being plasma treated shows that the polyvinylpyrrolidone (PVP) on the surface of the nanometal (such as silver nanowires) surface has been decomposed and removed, and nodes of the nanometal percolation network are sintered and combined with each other, which greatly reduces the contact resistance among the nanometals and improves the conductivity of the first conductive metal pattern.

In addition, a specific structure is formed on the surface of the nanometal after the plasma treatment. The specific structure shows that there are many uniformly distributed nano "protrusions" on the surface of the nanometal. These protrusions are beneficial for improving the bonding force between the nanometal and other materials.

It should be noted that, the time and power parameters of the above plasma treatment can be controlled according to requirements. If the intensity or time of the plasma treatment is not enough, the specific protrusion structure may not be formed and the sintering effect may not be achieved. If the intensity of the plasma treatment is too high or the time of the plasma treatment is too long, the nanometal wires may be fused and the nanometal conductive mesh may be destroyed. In this way, the desired effect can be achieved better by plasma treatment within the above-mentioned time and power ranges.

For example, in an embodiment of the present disclosure, a thickness of the first conductive metal pattern ranges from about 1 μm to about 10 μm and a thickness of the polyimide varnish ranges from about 50 μm to about 250 μm, so that the first conductive metal pattern is completely embedded in the film of the polyimide varnish. The polyimide varnish may be a mixed solution obtained by dissolving a polyimide and/or polyimide precursor in an organic solvent. The mixed solution may be applied on the substrate and then solidified by heating to form a polyimide film on the substrate. The organic solvent may be removed by volatilization, and any proper organic solvent may be selected.

Figure 2:
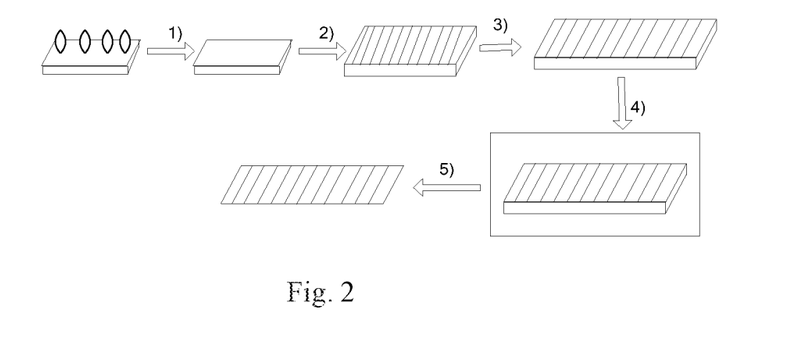
FIG. 2 is a process diagram corresponding to the flow diagram of the manufacturing method as illustrated in FIG. 1.

For example, FIG. 2 is a process diagram corresponding to the flow diagram of a manufacturing method as illustrated in FIG. 1. As illustrated in FIG. 2, it takes the first conductive metal ink including silver nanowires as an example, and the process includes the following steps:

1) applying silver nanowire ink onto a surface of a clean first substrate;

2) applying a photoresist on the first substrate coated with silver nanowire ink, then performing exposure, developing and other lithography processes to form a first conductive metal pattern;

3) plasma treating the first substrate having the first conductive metal pattern, and removing insulating materials such as polyvinylpyrrolidone (PVP) from the surface of the first conductive metal pattern;

4) applying a transparent polyimide varnish on the surface of the first substrate having the first conductive metal pattern;

5) soaking the first substrate coated with the polyimide varnish in a deionized water tank, and detaching the polyimide varnish and the first conductive metal pattern from the first substrate after moisture absorption and swelling in deionized water to obtain a transparent flexible polyimide varnish film containing a nanosilver pattern.

It should be noted that, a flexible conductive film with the first conductive metal pattern on a surface of the solidified polyimide varnish is obtained. The flexible conductive film prepared can be used in a flexible display panel. The polyimide varnish has a good flexibility. The polyimide varnish has a strong adhesion and a high mechanical strength in a case that it is arranged on polymer materials such as a flexible substrate. This method is easy to be realized, and the competitive power of the product is improved while the quality of the product is improved, and the method can be widely used.

Figure 3:
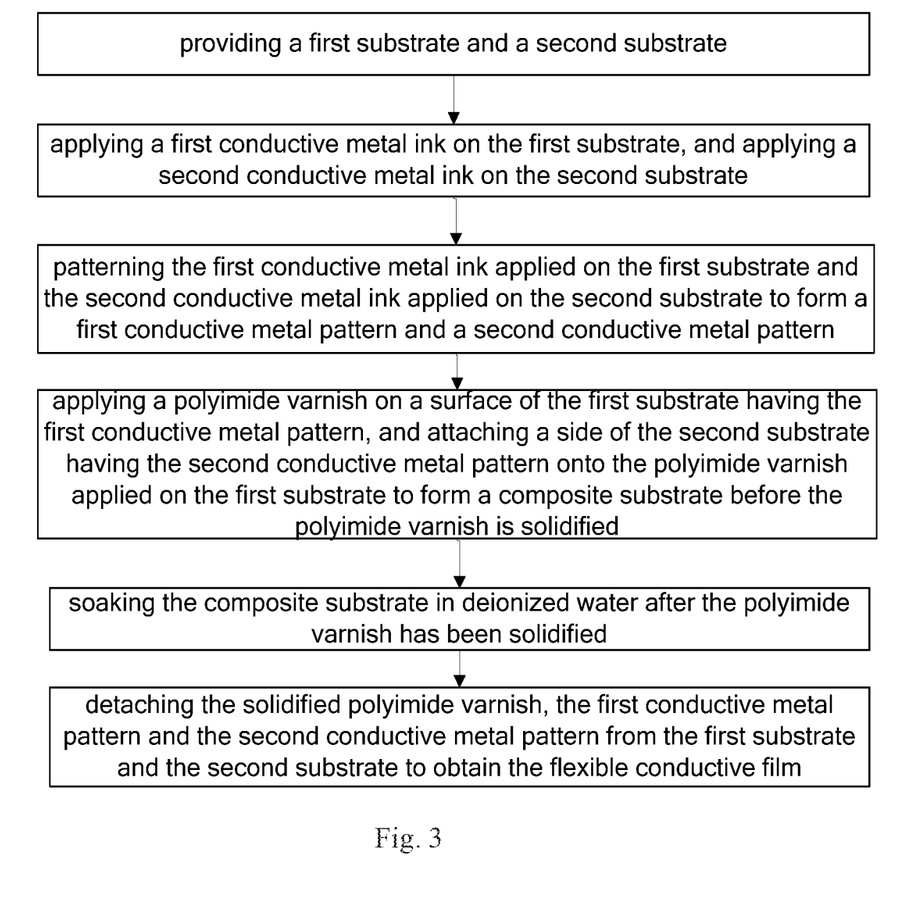
FIG. 3 is a flow diagram of a manufacturing method of a flexible conductive film provided by another embodiment of the present disclosure.

At least one embodiment of the present disclosure further provides a manufacturing method of a flexible conductive film. FIG. 3 is a flow diagram of a manufacturing method of a flexible conductive film provided by an embodiment of the present disclosure. As illustrated in FIG. 3, the manufacturing method of the flexible conductive film includes the following steps:

Firstly, providing a first substrate and a second substrate. For example, the first substrate and the second substrate are glass substrates, quartz substrates, and so on.

Applying a first conductive metal ink on the first substrate, and applying a second conductive metal ink on the second substrate. For the property, material and thickness of the first conductive metal ink and the second conductive metal ink, please refer to the above related description on the first conductive metal ink, and their detailed description will be omitted herein. Similarly, the nanometal in the first conductive metal ink and the second conductive metal ink may be prepared by a liquid phase reduction method. Insulating polyvinylpyrrolidone (PVP) is usually retained on the surface of the nanometal prepared by the liquid phase reduction method. For example, the conductive metal in the first conductive metal ink and the second conductive metal ink may include nanosilver, nanogold or nanocopper, etc., and the nanometal may be in a form of nanometal wires or nanometal particles.

Patterning the first conductive metal ink applied on the first substrate and the second conductive metal ink applied on the second substrate to form the first conductive metal pattern and the second conductive metal pattern. Similarly, the first conductive metal pattern and the second conductive metal pattern may be formed by a photolithography process, and their detailed description will be omitted herein. Please refer to the above related description.

Applying a polyimide varnish on a surface of the first substrate having the first conductive metal pattern, and attaching a side of the second substrate having the second conductive metal pattern onto the polyimide varnish applied on the first substrate before the polyimide varnish is solidified to form a composite substrate. In this way, a structure that the polyimide varnish, the first conductive metal pattern, and the second conductive metal pattern sandwiched between the first substrate and the second substrate is formed.

Soaking the composite substrate in deionized water after the polyimide varnish has been solidified. After placing the solidified polyimide varnish, the first substrate and the second substrate into the deionized water, the polyimide varnish is easy to be removed from the first substrate and the second substrate due to moisture absorption and swelling in the deionized water.

Detaching the solidified polyimide varnish, the first conductive metal pattern and the second conductive metal pattern from the first substrate and the second substrate to obtain the flexible conductive film. The flexible conductive film is a film in which the first conductive metal pattern and the second conductive metal pattern are embedded in the two surfaces of the solidified polyimide varnish respectively.

The first conductive metal pattern and the second conductive metal pattern may be any patterns according to requirements. As illustrated in FIG. 4B, the first conductive metal pattern 23 and the second conductive metal pattern 25 are disposed on the two sides of the polyimide varnish film (not illustrated in FIG. 4B) respectively. In FIG. 4B, the first conductive metal pattern 23 comprises a plurality of first strip electrodes extending horizontally and parallel to each other, and the second conductive metal pattern 25 comprises a plurality of second strip electrodes extending along a vertical direction and parallel to each other. The plurality of first strip electrodes of the first conductive metal pattern 23 and the plurality of second strip electrodes of the second conductive metal pattern 25 cross each other. The flexible conductive film illustrated in FIG. 4B can be applied to a mutual capacitive touch screen wherein a detection capacitor is formed at an intersection of each first strip electrode and each second strip electrode.

For example, as illustrated in FIG. 4C, the first conductive metal pattern 33 and the second conductive metal pattern 35 are disposed on the two sides of the polyimide varnish film (not illustrated in FIG. 4C) respectively. The first conductive metal pattern 33 comprises a plurality of first strip electrodes arranged in a horizontal direction with uniform intervals. Each of the first strip electrodes comprises wide portions and narrow portions which are arranged alternately and sequentially connected. The second conductive metal pattern 35 comprises a plurality of second strip electrodes arranged in a vertical direction with uniform intervals. Each of the second strip electrodes comprises wide portions and narrow portions which are arranged alternately and sequentially connected. The flexible conductive film illustrated in FIG. 4C can also be applied to a mutual capacitive touch screen wherein a detection capacitor is formed at an intersection of each first strip electrode and each second strip electrode.

For example, between forming the first conductive metal pattern on the first substrate and applying the polyimide varnish, the first conductive metal pattern and the second conductive metal pattern may be plasma treated to remove insulating materials such as polyvinylpyrrolidone (PVP) from the surfaces of the first conductive metal pattern and the second conductive metal pattern. For the power, the processing time, the protective atmosphere and the reactive atmosphere used in plasma treatment, please refer to the above related description, and the detailed description will be omitted herein.

It should be noted that, in an embodiment of the present disclosure, a thickness of the first conductive metal pattern may range from about 1 μm to about 10 μm, a thickness of the second conductive metal pattern may range from about 1 μm to about 10 μm, and a thickness of the polyimide varnish may range from about 50 μm to about 250 μm. In this way, both the first conductive metal pattern 23 and the second conductive metal pattern 25 are completely embedded in the film of the polyimide varnish.

Figure 4A:
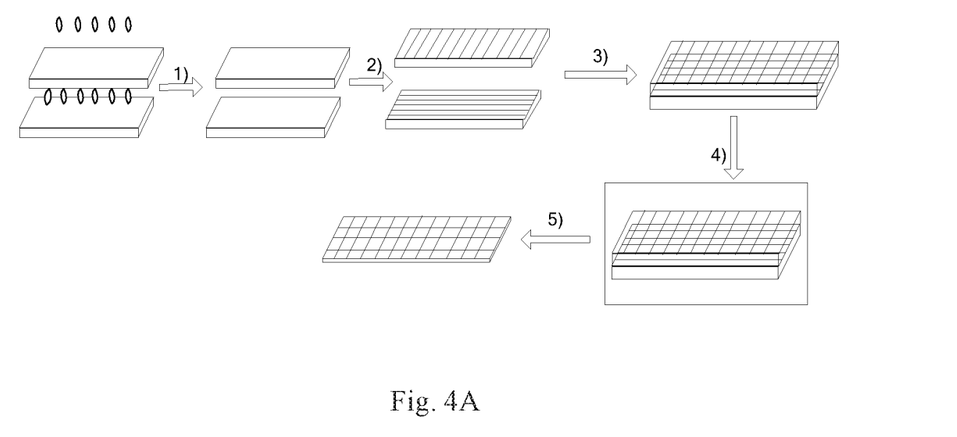
FIG. 4A is a process diagram corresponding to the flow diagram of the manufacturing method as illustrated in FIG. 3.
Figure 4B:
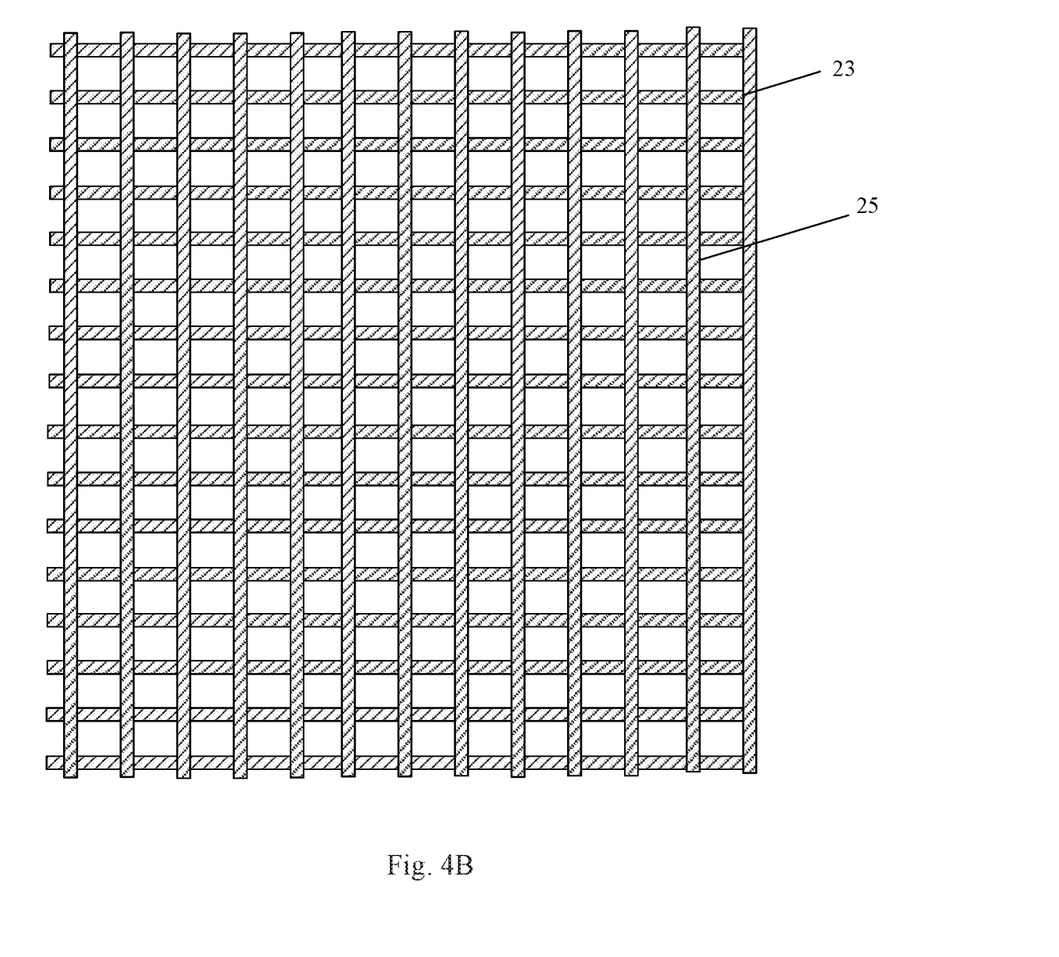
FIG. 4B and FIG. 4C schematically show conductive metal patterns of a flexible conductive film.
Figure 4C:
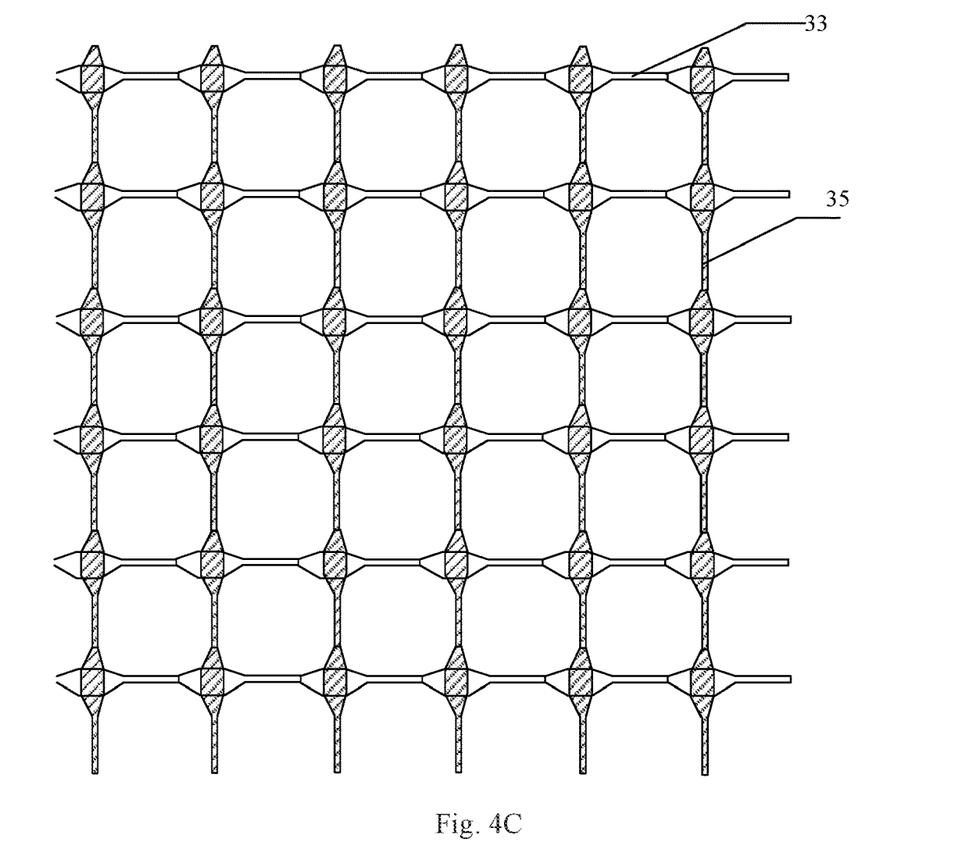

For example, FIG. 4A is a process diagram corresponding to the flow diagram of a manufacturing method as illustrated in FIG. 3. As illustrated in FIG. 4A, the process comprises the following steps (taking nanosilver as an example of the nanoconductive metal).

1) applying a first conductive metal ink including silver nanowires on a surface of a clean first substrate, and applying a second conductive metal ink including silver nanowires on a surface of a clean second substrate.

2) applying a photoresist on the first substrate coated with the first conductive metal ink including the silver nanowires, and applying a photoresist on the second substrate coated with the second conductive metal ink including the silver nanowires, then subjecting the first conductive metal ink and the second conductive metal ink to lithography processes such as exposure and developing to obtain the first conductive metal pattern and the second conductive metal pattern on the first substrate and the second substrate respectively.

3) plasma treating the first substrate having the first conductive metal pattern and the second substrate having the second conductive metal pattern, and removing insulating materials such as polyvinylpyrrolidone (PVP) from the surfaces of the first conductive metal pattern and the second conductive metal pattern.

4) applying a transparent polyimide varnish on a surface of the first substrate having the first conductive metal pattern, attaching the second substrate on the surface of the polyimide varnish, and then solidifying the polyimide varnish;

5) soaking in a deionized water tank the composite substrate formed by assembling the first substrate and the second substrate, and detaching the polyimide varnish, the first conductive metal pattern and the second conductive metal pattern from the first substrate and the second substrate after moisture absorption and swelling in deionized water, to obtain a transparent flexible polyimide varnish film containing nanosilver patterns.

In the embodiments of the present disclosure, the first conductive metal pattern and the second conductive metal pattern may be obtained by other methods. For example, the first/second conductive metal pattern may be obtained in the process of applying the first/second conductive metal ink onto the first/second substrate by inkjet printing or screen printing.

In the embodiments of the present disclosure, the first conductive metal pattern and the second conductive metal pattern may be obtained by using a same conductive metal ink or different conductive metal inks. For instance, during applying the first/second conductive metal ink on the first/second substrate to obtain the first/second conductive metal pattern, the first conductive metal ink and the second conductive metal ink used may be different. For example, the two conductive metal inks may contain different nanometals.

It should be noted that, the flexible conductive thin film as prepared has the first conductive metal pattern on one surface of the solidified polyimide varnish and the second conductive metal pattern on the other surface of the solidified polyimide varnish, and the first conductive metal pattern and the second conductive metal pattern are separated by the insulating polyimide varnish. The first conductive metal pattern crosses the second conductive metal pattern in the spatial distribution. The flexible conductive film can be used in a flexible touch screen. The polyimide varnish has a good flexibility. The polyimide varnish has a strong adhesion and a high mechanical strength in a case that it is arranged on polymer materials such as a flexible substrate. This method is easy to be realized, and the competitive power of the product is improved while the quality of the product is improved, and the method can be widely used.

At least one embodiment of the present disclosure further provides a flexible conductive film which is prepared by the above manufacturing method. The flexible conductive film includes the solidified polyimide varnish and the conductive metal pattern(s) embedded in the polyimide varnish.

For example, the conductive metal pattern includes the first conductive metal pattern and/or the second conductive metal pattern.

For example, conductive material of the conductive metal pattern comprises any one of nanosilver, nanogold and nanocopper.

Figure 5:
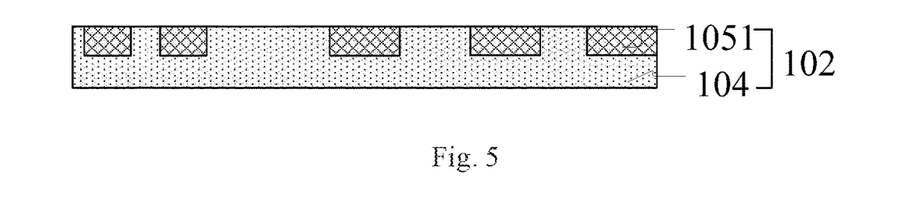
FIG. 5 schematically shows a cross section structure of a flexible conductive film provided by an embodiment of the present disclosure.

For example, FIG. 5 is a schematic diagram of a flexible conductive film prepared by the manufacturing method as illustrated in FIG. 1. As illustrated in FIG. 5, one surface of the polyimide varnish has the first conductive metal pattern 1051.

Figure 6:
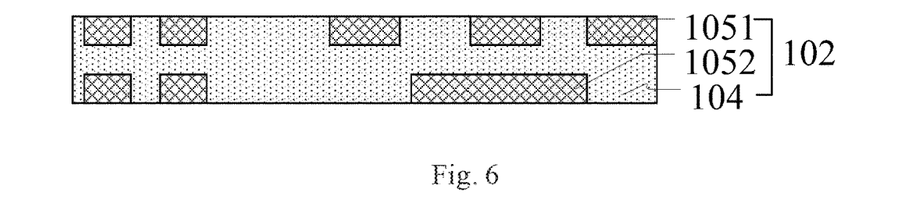
FIG. 6 schematically shows a cross section structure of a flexible conductive film provided by another embodiment of the present disclosure.

For example, FIG. 6 is a schematic diagram of a flexible conductive film prepared by the manufacturing method as illustrated in FIG. 3. As illustrated in FIG. 6, the flexible conductive film includes the polyimide varnish 104, the first conductive metal pattern 1051 embedded in a first surface of the polyimide varnish, and the second conductive metal pattern 1052 embedded in a second surface of the polyimide varnish.

For example, as illustrated in FIG. 6, the solidified polyimide varnish 104 separates the first conductive metal pattern 1051 from the second conductive metal pattern 1052 for insulation therebetween.

For example, as illustrated in FIG. 6, the first conductive metal pattern 1051 has a thickness ranging from about 1 μm to about 10 μm, the second conductive metal pattern 1052 has a thickness ranging from about 1 μm to about 10 μm, and the polyimide varnish 104 has a thickness ranging from about 50 μm to about 250 μm.

Figure 7:
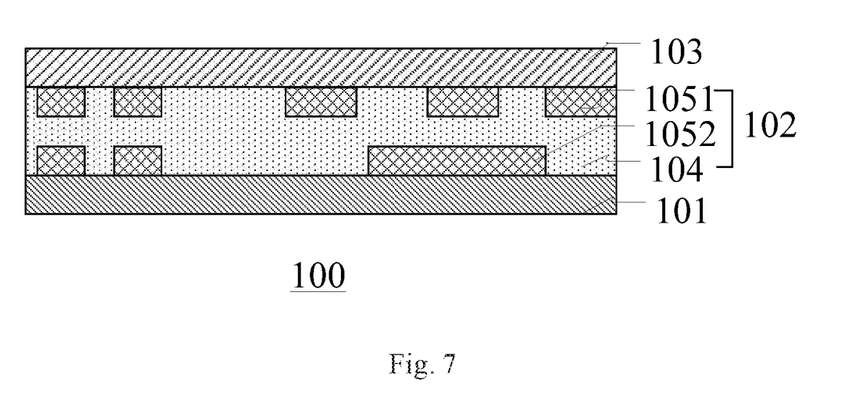
FIG. 7 schematically shows a cross section structure of a flexible touch screen provided by an embodiment of the present disclosure.

At least one embodiment of the present disclosure further provides a flexible touch screen 100. For example, FIG. 7 schematically shows a cross section structure of the flexible touch screen, and the flexible touch screen comprises: a flexible substrate 101 and the flexible conductive film 102 disposed on the flexible substrate 101. According to requirements, the flexible touch screen 100 may further include a protection film 103 arranged on the flexible conductive film 102.

For instance, the protective film 103 may be made of a transparent insulating material. For example, the transparent insulating material is an inorganic insulating material such as silica or silicon oxynitride, or an organic insulating material such as a resin. Apparently, it is not limited to the materials listed, and the protective film 103 may also be made of other materials having the similar properties.

The flexible conductive film 102 provided by an embodiment of the present disclosure is located on the flexible substrate 101. For example, the flexible conductive film 102 comprises a solidified polyimide varnish 104 as well as a first conductive metal pattern 1051 and a second conductive metal pattern 1052 embedded in the solidified polyimide varnish 104. The planar shapes of the first conductive metal pattern 1051 and the second conductive metal pattern 1052 may be for example as shown in FIG. 4B and FIG. 4C. However, the embodiments of the present disclosure are not limited to these specific shapes and arrangements. Further, the first conductive metal pattern 1051 and the second conductive metal pattern 1052 may be connected to the touch control chips via lead wires (not illustrated in figures).

For example, the flexible substrate 101 has thermoplasticity and transparency in visible light region, and the materials meeting such requirements may be used for manufacturing the flexible transparent substrate. For example, the material used for manufacturing the flexible substrate comprises: polyethylene terephthalate, polybutylene terephthalate, polyethylene naphthalate or polycarbonate. The size and shape of the flexible transparent substrate can be determined according to the size of the conductive film to be actually manufactured.

The flexible conductive film included in the flexible touch screen provided by at least one embodiment of the present disclosure is prepared by any method of manufacturing a flexible conductive film described above, and the detailed description will be omitted herein.

Figure 8:
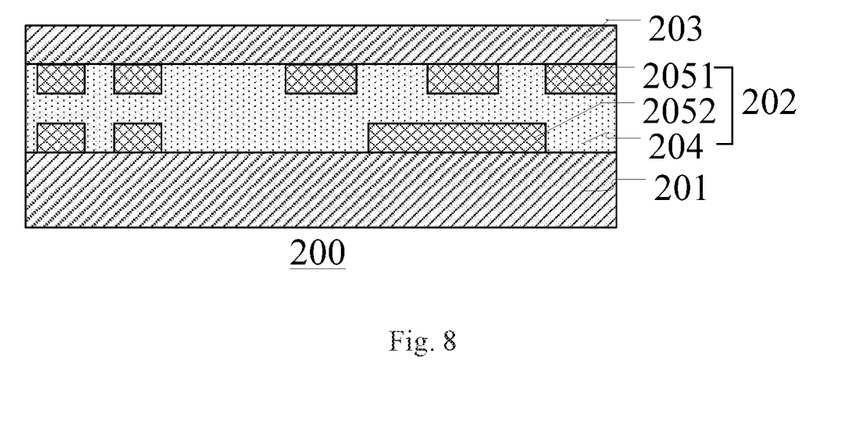
FIG. 8 schematically shows a cross section structure of a flexible display panel provided by an embodiment of the present disclosure.

At least one embodiment of the present disclosure further provides a flexible display panel. As illustrated in FIG. 8, the flexible display panel 200 comprises a flexible substrate 201 and a flexible conductive film 202 disposed on the flexible substrate 201. According to requirements, the flexible display panel 200 may further comprise a protection film 203 disposed on the flexible conductive film 202.

The flexible conductive film 202 is located on the flexible display panel 201. For example, the flexible conductive film 202 comprises a solidified polyimide varnish 204 and a first conductive metal pattern 2051 and a second conductive metal pattern 2052 embedded in the solidified polyimide varnish 204. The planar shapes of the first conductive metal pattern 2051 and the second conductive metal pattern 2052 may be for example as shown in FIG. 4B and FIG. 4C. However, the embodiments of the present disclosure are not limited to these specific shapes and arrangements. Further, the first conductive metal pattern 2051 and the second conductive metal pattern 2052 may be connected to the touch control chips via lead wires (not illustrated in figures).

For the material and design of the protective film 203, please refer to the above related description, and the detailed description will be omitted herein.

In the embodiment, the flexible display panel may for example, be an electronic paper flexible display panel, an organic light-emitting diode (OLED) flexible display panel, a liquid crystal flexible display panel or the like, which may be implemented as a television, a digital camera, a mobile phone, a watch, a tablet computer, a notebook computer, a navigation system and any other product or component having a display function.

Embodiments of the present disclosure relate to a flexible conductive film, its manufacturing method, a flexible touch screen and a flexible display panel, which have at least one beneficial effect as following.

(1) the insulating material polyvinylpyrrolidone (PVP) is removed from the surface of the nanometal by plasma treating, thus improving the conductivity of the conductive metal pattern;

(2) embedding the conductive nanometal pattern in the polyimide varnish to form the flexible conductive film increases the adhesion of the nanometal to the surface of flexible polymers and improves the mechanical strength;

(3) the method is easy to be realized, and the competitive power of the product is improved while the quality of the product is improved, and the method can be widely used.

Please note that:

(1) the drawings of the embodiments of the present disclosure are only related to the structures mentioned in the embodiments of the present disclosure, and other structures can be obtained by general designs;

(2) for the sake of clarity, sizes of layers or regions in the drawings for describing the embodiments of the present disclosure are not drawn according to an actual scale but are exaggerated or diminished; and (3) the embodiments of the present disclosure and the features therein can be combined with each other in the absence of conflict.

What are described above is related to only the illustrative embodiments of the disclosure and not limitative to the scope of the disclosure. The scopes of the disclosure are defined by the accompanying claims.

The application claims priority of Chinese Patent Application No. 201610741256.7, filed on Aug. 26, 2016, the disclosure of which is incorporated herein by reference in its entirety as part of the present application.

What is claimed is:

1. A manufacturing method of a flexible conductive film, the flexible conductive film comprising a solidified polyimide varnish film and a first conductive metal pattern and a second conductive metal pattern embedded in the solidified polyimide varnish film, the manufacturing method comprising:

providing a first substrate;

applying a first conductive metal ink on the first substrate and forming the first conductive metal pattern;

providing a second substrate;

applying a second conductive metal ink on the second substrate and forming the second conductive metal pattern insulated from and intersected with the first conductive metal pattern;

applying a polyimide varnish film on a first surface of the first substrate having the first conductive metal pattern and a second surface of the second substrate having the second conductive metal pattern and facing the first surface of the first substrate;

wherein the first conductive metal pattern has a thickness rammed from about 1 µm to about 10 µm, the second conductive metal pattern has a thickness ranged from about 1 µm to about 10 µm, and the polymide varnish film has a thickness ranged from 50 µm to 250 µm to allow the first conductive metal pattern and the second conductive metal pattern to be completely embedded in the polymide varnish film;

soaking the first substrate and the second substrate in deionized water after the polyimide varnish film has been solidified; and detaching the solidified polyimide varnish film and the first conductive metal pattern and the second conductive metal pattern from the first substrate to obtain the flexible conductive film.

2. The manufacturing method according to claim 1, further comprising:

attaching a side of the second substrate having the second conductive metal pattern onto the polyimide varnish applied on the first substrate before the polyimide varnish is solidified; and soaking the first substrate and the second substrate in deionized water after the polyimide varnish film sandwiched between the first substrate and the second substrate has been solidified.

3. The manufacturing method according to claim 1, further comprising: plasma treating the first conductive metal pattern to remove insulating material from the first conducting metal pattern.

4. The manufacturing method according to claim 2, further comprising: plasma treating the second conductive metal pattern to remove insulating material from the second conducting metal pattern.

5. The manufacturing method according to claim 3, wherein the insulating material comprises polyvinylpyrrolidone.

6. The manufacturing method according to claim 3, wherein plasma treating is carried out in a protective atmosphere or in a reactive atmosphere.

7. The manufacturing method according to claim 6, wherein the protective atmosphere is any one or any combination of argon, helium, nitrogen and neon.

8. The manufacturing method according to claim 6, wherein the reactive atmosphere is any one or any combination of air, oxygen, hydrogen, ammonia, and carbon dioxide.

9. The manufacturing method according to claim 1, wherein the first conductive metal ink comprises nanosilver, nanogold or nanocopper.

10. The manufacturing method according to claim 1, wherein the first conductive metal ink comprises nanometal wires or nanometal particles.

11. The manufacturing method according to claim 2, wherein the second conductive metal ink comprises nanosilver, nanogold or nanocopper.

12. The manufacturing method according to claim 2, wherein the second conductive metal ink comprises nanometal wires or nanometal particles.

13. The manufacturing method according to claim 2, wherein the first conductive metal ink is different from the second conductive metal ink.

14. A flexible conductive film, comprising:

a solidified polyimide varnish and a conductive metal pattern embedded in the solidified polyimide varnish;

wherein the conductive metal pattern comprises a first conductive metal pattern embedded in a first surface of the solidified polyimide varnish film and a second conductive metal pattern embedded in a second surface of the solidified polyimide varnish film;

the first conductive metal pattern is separated from the second conductive metal pattern by the solidified polyimide varnish film; and the first conductive metal pattern has a thickness n from about 1 µm to about 10 µm, the second conductive metal pattern has a thickness n from about 1 µm to about 10 µm, and the polyimide varnish film has a thickness from about 50 µm to about 250 µm to allow the first conductive metal pattern and the second conductive metal pattern to completely embedded in the polymide varnish film.

15. The flexible conductive film according to claim 14, wherein the conductive metal pattern is made of nanosilver, nanogold or nanocopper.

16. A flexible touch screen, comprising:

a flexible substrate; and a flexible conductive film disposed on the flexible substrate, wherein the flexible conductive film comprises a solidified polyimide varnish film and a conductive metal pattern embedded in the solidified polyimide varnish film;

wherein the conductive metal pattern comprises a first conductive metal pattern embedded in a first surface of the solidified polyimide varnish film and a second conductive metal pattern embedded in a second surface of the solidified polyimide varnish film;

the first conductive metal pattern is separated from the second conductive metal pattern by the solidified polyimide varnish film; and the first conductive metal pattern has a thickness from about 1 µm to about 10 µm, the second conductive metal pattern has a thickness from about 1 µm to about 10 µm, and the polyimide varnish film has a thickness from about 50 µm to about 250 µm to allow the first conductive metal pattern and the second conductive metal pattern to completely embedded in the polymide varnish film.

17. A flexible display panel, comprising:

a flexible substrate; and the flexible conductive film according to claim 14 disposed on the flexible substrate.

* * * * *

UNITED STATES PATENT AND TRADEMARK OFFICE
CERTIFICATE OF CORRECTION

PATENT NO. : 10,973,118 B2  
APPLICATION NO. : 15/751031  
DATED : April 6, 2021  
INVENTOR(S) : Haifeng Hu Page 1 of 1

It is certified that error appears in the above-identified patent and that said Letters Patent is hereby corrected as shown below:

On the Title Page

Item (73) delete:
"BOE TECHNOLOGY GROUP CO., LTD. Beijing (CN)
HEFEI XINGSHENG OPTOELECTRONICS CO., LTD. Anhui (CN)"

Insert:
--BOE TECHNOLOGY GROUP CO., LTD. Beijing (CN)
HEFEI XINSHENG OPTOELECTRONICS TECHNOLOGY CO., LTD. Anhui (CN)--

Signed and Sealed this  
Third Day of August, 2021

Drew Hirshfeld  
*Performing the Functions and Duties of the*  
*Under Secretary of Commerce for Intellectual Property and*  
*Director of the United States Patent and Trademark Office*